(12) United States Patent
Morozumi et al.

(10) Patent No.: US 6,194,304 B1
(45) Date of Patent: Feb. 27, 2001

(54) SEMICONDUCTOR DEVICE AND METHOD OF FABRICATING THE SAME

(75) Inventors: Yukio Morozumi; Michio Asahina; Naohiro Moriya; Kazuki Matsumoto, all of Chino; Eiji Suzuki, Fujimi, all of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/300,378

(22) Filed: Apr. 27, 1999

Related U.S. Application Data

(62) Division of application No. 09/104,403, filed on Jun. 25, 1998.

(30) Foreign Application Priority Data

Jul. 3, 1997 (JP) .................................................. 9-178091
Nov. 25, 1997 (JP) .................................................. 9-339303

(51) Int. Cl.[7] .................................................. H01L 21/44

(52) U.S. Cl. .......................... 438/618; 438/622; 438/643; 438/675; 438/664

(58) Field of Search .................................. 438/618, 622, 438/636, 643, 648, 143, 284, 301, 476, 542, 763, 653, 654, 660, 675, 688, 909, 927, 655, 664; 257/306, 307, 532, 908, 308, 309

(56) References Cited

U.S. PATENT DOCUMENTS

| | | | | |
|---|---|---|---|---|
| 3,571,914 | * | 3/1971 | Lands et al. | 438/143 |
| 5,371,042 | * | 12/1994 | Ong | 438/653 |
| 5,504,043 | * | 4/1996 | Ngan et al. | 438/655 |
| 5,712,194 | * | 1/1998 | Kanazawa | 438/618 |
| 5,716,890 | * | 2/1998 | Yao | 438/624 |
| 5,811,849 | * | 9/1998 | Matsuura | 257/306 |

FOREIGN PATENT DOCUMENTS 9-092717 * 4/1997 (JP) .
9-102492 * 4/1997 (JP) .

OTHER PUBLICATIONS

T. Yoshie et al., "Deposition characteristics of $SiH_4/H_2O_2$ CVD $SiO_2$", Applied Physics Society, Spring 1997, 30p–F–15.
M. Kubo et al., "NMOS Hot Carrier Reliability Evaluation in CVD Oxide Using $SiH_4$ and $H_2O_2$ Chemistry", Applied Physics Society, Spring 1997, 28p–F–18.
M. Matsuura et al., "Substrate–dependent characteristics of CVD oxide using $SiH_4$ and $H_2O_2$ Chemistry (3)", Applied Physics Society, Autumn 1995, 26p–ZB–6.

(List continued on next page.)

Primary Examiner—Matthew Smith
Assistant Examiner—Igwe U. Anya
(74) Attorney, Agent, or Firm—Oliff & Berridge, PLC

(57) ABSTRACT

A process of forming an interlayer dielectric on a semiconductor substrate including an electronic element comprises at least the following steps (a) to (c):

(a) a step of forming a first silicon oxide layer by reacting a silicon compound including hydrogen with hydrogen peroxide using a chemical vapor deposition method;

(b) a step of forming a porous second silicon oxide layer by reacting between a compound including an impurity, silicon compounds, and at least one substance selected from oxygen and compounds including oxygen using a chemical vapor deposition method; and (c) a step of annealing at a temperature of 300° C. to 850° C. to make the first and second silicon oxide layers more fine-grained.

The first silicon oxide layer is formed at a temperature that is lower than that required for a BPSG film, and it has superior self-flattening characteristics in itself.

15 Claims, 7 Drawing Sheets

OTHER PUBLICATIONS

N. Nishimura et al., "A novel interlayer dielectric process using CVD oxide with $SiH_4$ and $H_2O_2$ chemistry (1)", Applied Physics Society, Spring 1995, 30a–C–3.

M. Matsuura et al., "A novel interlayer dielectric process using CVD oxide with $SiH_4/H_2O_2$ chemistry (2)", Applied Physics Society, Spring 1995, 30a–C–4.

S. McClatchie et al., "Low Dielectric Constant Flowfill Technology for IMD Applications", Electrotech Ltd., Date Unknown, pp. 26–32.

M. Matsuura et al., "An Advanced Planarizing Interlayer Dieletric Using $SiH_4$ and $H_2O_2$ Chemistry", Dry Process Symposium, 1995, pp. 261–268.

A. Kiermasz et al., "Planarisation for Sub–Micron Devices Utilising a New Chemistry", Presented at DUMIC Conference, California, Feb. 1995.

S. McClatche et al., "Inorganic CVD Planarisation", Printed in European Semiconductor, Sep. 1995.

* cited by examiner

SEMICONDUCTOR DEVICE AND METHOD OF FABRICATING THE SAME

This is a Division of application Ser. No. 09/104,403 filed Jun. 25, 1998.

BACKGROUND OF THE INVENTION

The present invention relates to a semiconductor device and a fabrication method therefor, and, in particular, to a semiconductor device having an interlayer dielectric and a fabrication therefor that enables fabrication at below the half-micron level.

In a semiconductor device such as an LSI, recent advances in miniaturization, integration, and multi-layering of electronic elements have raised vital technical problems concerning lowering the temperature at which interlayer dielectrics are formed, flattening those layers, and the techniques used for forming metal wiring.

To form such an interlayer dielectric, a silicon oxide layer is first grown at a low temperature by chemical vapor deposition on a substrate on which an electronic element or the like has been formed, then a vapor-phase reaction is induced between a silane compound, oxygen, or ozone and a gas containing an impurity such as phosphorus or boron to form a layer of a boron-phospho silicate glass (BPSG) to a thickness of several hundred mm to 1 μm. Subsequently, the layer is annealed at a high temperature in a nitrogen environment, to cause the BPSG film to liquefy in a high-temperature flow, to flatten it. After through-holes (contact holes) are formed in the thus-fabricated interlayer dielectric and a barrier layer of titanium or titanium nitride is formed thereon, a metal wiring layer is formed.

This flattening of the interlayer dielectric that uses a BPSG film makes use of the high-temperature flow characteristics of the BPSG film, and the flattening proceeds faster as the density of impurities in the BPSG film and the temperature of the annealing increase. To obtain a sufficient degree of flatness and fineness of the BPSG film, an annealing temperature of at least 850° C. is required.

However, to prevent the occurrence of punch-through between miniaturized MOS transistors, it is important to suppress any excessive broadening of the source and drain impurity layers caused by the annealing, and thus it is preferable to keep the processing temperature to not more than 850° C. When a layer of a silicide such as titanium silicide is formed on the surfaces of the source and drain impurity layers that configure a MOS transistor, high-temperature annealing will cause the region of the silicide layer to become broader than necessary, which leads to deterioration of the connectivity characteristics. For that reason, there is a demand for a technique that makes it possible to form this interlayer dielectric at a relatively low temperature.

SUMMARY OF THE INVENTION

An objective of the present invention is to provide a semiconductor device comprising an interlayer dielectric on a semiconductor substrate, which makes it possible to form a film at a lower temperature than that required for a conventional art interlayer dielectric using a BPSG film, which has an extremely good degree of flatness, and which also makes it possible to fabricate a highly reliable contact structure. The present invention also provides a method of fabricating such a semiconductor device.

The method of fabricating a semiconductor device in accordance with the present invention comprises:

a step of forming an interlayer dielectric on a semiconductor substrate including an electronic element;

a step of forming a through-hole in the interlayer dielectric;

a step of forming a barrier layer on surfaces of the interlayer dielectric and the through-hole; and a step of forming a conductive layer on a surface of the barrier layer, and wherein the step of forming an interlayer dielectric comprises at least the following steps (a) to (c):

(a) a step of forming a first silicon oxide layer by reacting a silicon compound with hydrogen peroxide using a chemical vapor deposition method;

(b) a step of forming a porous second silicon oxide layer by reacting a compound including an impurity with silicon compounds and at least one substance selected from oxygen, and compounds including oxygen using a chemical vapor deposition method; and (c) a step of annealing at a temperature of 300° C. to 850° C.

Step (a) of this method of fabricating a semiconductor device makes it possible to form an extremely flat layer by using a chemical vapor deposition method to cause a reaction between a silicon compound and hydrogen peroxide. In other words, the first silicon oxide layer formed by this step (a) is inherently highly fluid, and has superior self-flatt characteristics. The mechanism thereof is thought to be d the fact that, when silicon compound and hydrogen peroxide made to react by a chemical vapor deposition method, si is formed in the vapor phase, and the deposition of silanol on the wafer surface causes the formation of a having a high degree of fluidity.

When monosilane is used as the silicon compound, example, the reactions given by Equation 1 and 1' below r in the formation of silanol:

$$SiH_4 + 2H_2O_2 \rightarrow Si(OH)_4 + 2H_2 \qquad \text{Equation 1}$$

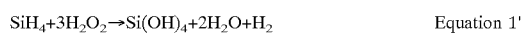

$$SiH_4 + 3H_2O_2 \rightarrow Si(OH)_4 + 2H_2O + H_2 \qquad \text{Equation 1'}$$

The silanol formed in accordance with Equations 1 a desorbs water by the polycondensation reaction of Equati to form silicon oxide.

$$Si(OH)_4 \rightarrow SiO_2 + 2H_2O \qquad \text{Equation 2}$$

Examples of silicon compounds that could be used inorganic silane compounds such as monosilane, disi $SiH_2Cl_2$, $SiF_4$, and $CH_3SiH_3$; and organic silane compounds such tripropylsilane and tetraethoxysilane.

The film formation of step (a) is preferably perfori under temperature conditions of 0° C. to 20° C. if the si compound is an inorganic silane compound, or under tempera conditions of 100° C. to 150° C. if the silicon compound i organic silane compound. If the temperature of this formation step is higher than the above maximum value, polycondensation reaction of Equation 2 proceeds too reducing the fluidity of the first silicon oxide layer making it difficult to obtain a good flatness. If temperature is lower than the above minimum value, the disassociated moisture will be adsorbed within the chamber and condensation will occur outside of the chamber, making it difficult to control the fabrication apparatus.

The first silicon oxide layer formed in step (a) is preferably formed to a sufficient thickness to cover any gaps in the surface of the silicon substrate. The minimum thickness of the first silicon oxide layer depends on the height of any unevenness in the surface of the silicon substrate comprising the electronic element, but this thickness is preferably 300 to 1000 nm. If the thickness of the first silicon oxide layer exceeds that maximum value, stresses in the layer itself will cause cracks to occur.

In step (b), a reaction is induced between a compound comprising an impurity, silicon compounds and at least one substance selected from oxygen and compounds comprising oxygen, to form the porous second silicon oxide layer on the first silicon oxide layer.

Not only does this second silicon oxide layer function as a capping layer, its porosity also allows any gaseous components that are generated from the first silicon oxide layer to escape. In addition to being porous, this second silicon oxide layer including an impurity such as phosphorus or boron, but preferably phosphorus, so that it can mitigate stresses within that layer by weakening the strength of bonds between Si and O molecules of the silicon oxide of that layer. A further important role of this second silicon oxide layer is that the impurity, such as phosphorus, within the silicon oxide layer functions as a getter of mobile ions, such as alkali ions, that have an adverse effect on the reliability of the electronic element. The density of the impurity within the second silicon oxide layer is preferably 1 to 6 wt % considering from the viewpoints of this gettering function and the mitigation of stresses in the film.

The second silicon oxide layer has a compressive stress of 100 to 600 MPa, so it has the function of preventing any increase in the tension stresses that occur in the first silicon oxide layer during the polycondensation, thus preventing cracking. This second silicon oxide layer has the further function of prevention the absorption of moisture by the first silicon oxide layer.

This step (b) is preferably performed by a plasma chemical vapor deposition method under a temperature condition of 300° C. to 450° C. and at a high frequency of 1 MHz or less. Forming the film under these temperature conditions makes it easy for gaseous components to escape during the initial stage of annealing in step (c), further improving the reliability of the device.

The compound comprising oxygen that is used in the step (b) is preferably nitrous oxide ($N_2O$). The use of nitrous oxide as the reaction gas makes it possible to encourage the desorption of gaseous components (hydrogen and water) within the first silicon oxide layer during the formation of the second silicon oxide layer, because nitrous oxide in a plasma state facilitates the reaction with the hydrogen bonds (—H) in the silicon compound of the first silicon oxide layer.

Instead of a plasma chemical vapor deposition methods step (b) could be performed by a normal-pressure chemical vapor deposition method under a temperature condition of 300° C. to 550° C. In such a case, the compound comprising oxygen used in step (b) is preferably ozone.

It is also preferable to expose the first silicon oxide layer to an ozone environment before the second silicon oxide layer is formed in step (b). Such an exposure encourages the desorption of hydrogen and water from the first silicon oxide layer because ozone facilitates the reactions between the hydrogen bonds (—H) and hydroxyl groups (—OH) in the silicon compound of the first silicon oxide layer.

The thickness of the second silicon oxide layer is determined from considerations of flatness and crack prevention, and is preferably at least 100 nm.

Performing the annealing in step (c) at a temperature of 300° C. to 850° C., preferably 600° C. to 850° C., makes the first and second silicon oxide layers more fine-grained and improves the insulating properties and moisture resistance thereof.

In other words, as seen from the first silicon oxide layer, the polycondensation reaction defined by Equation 2 is completed in the initial stages of this annealing and the water and hydrogen generated by this reaction are released to the outside through pores in the second silicon oxide layer, so that the first silicon oxide layer is formed to be fine-grained in a state in which the gaseous components have been thoroughly removed therefrom. In addition, the second silicon oxide layer is converted from a porous state to a fine-grained one by this annealing.

By setting the temperature to at least 300° C. in this annealing, it is possible to make the first and second silicon oxide layers sufficiently fine-grained, and it is possible that the impurities in the source and drain diffusion layers of the MOS electronic element can be sufficiently activated. Setting this annealing temperature to not more than 850° C. makes it possible to flatten the interlayer dielectric at a temperature that is lower than that necessary for a conventional art BPSG film, and also ensures that the first and second silicon oxide layers are sufficiently fine-grained. An annealing temperature in excess of 850° C. causes problems such as an unnecessarily broadening of the source and drain diffusion layers leading to punch-through, which makes it difficult to miniaturize the electronic element.

Forming a porous second silicon oxide layer on the first silicon oxide layer ensures that the second silicon oxide layer has a suitable flexibility during the annealing of step (c), even if there is an rapid temperature change as that is when the wafer is directly put under a temperature from 300° C. to 850° C., so it can absorb the stresses of the first silicon oxide layer and thus the annealing can be performed without any cracks occurring in the first silicon oxide layer.

To ensure that cracking of the first silicon oxide layer is prevented, it is preferable that the annealing of step (c) is performed by ramping annealing, in which the temperature is raised-either continuously or intermittently.

It is preferable that a silicon oxide layer is formed to act as a base layer by using a chemical vapor deposition method to react silicon compounds with at least one substance selected from oxygen, and compounds comprising oxygen, before step (a). This base layer has both a passivation function that ensures that moisture and extra impurities do not migrate into the underlying silicon substrate from the first silicon oxide layer, and a function of increasing the adhesiveness between the silicon substrate and the first silicon oxide layer.

The fabrication method in accordance with the present invention may create a tapered through-hole of a diameter that decreases gradually from an upper edge portion to a base portion thereof, through the interlayer dielectric obtained by this fabrication method. In other words, since the first silicon oxide layer has an etching speed that is slightly slower than that of the second silicon oxide layer, and these first and the second silicon oxide layers are firmly bonded each other at the boundary surfaces thereof, it is possible to form a through-hole therein that has an ideal straight-line taper with no discontinuities. A film of aluminum or an aluminum alloy can be embedded within this tapered through-hole by sputtering or the like, making it possible to create a contact structure having an excellent conductivity.

Instead of being formed by anisotropic dry-etching, this through-hole could be formed by a combination of isotropic wet-etching and anisotropic dry-etching, so that the upper edge portion thereof can be formed to have a more curved tapered shape.

In-addition, it is preferable that a first aluminum layer is first formed within this through-hole at a temperature of 200° C. or less from aluminum or an alloy in which aluminum is the main component. Then a second aluminum layer may be formed thereon at a temperature of at least 300° C. from aluminum or an alloy in which aluminum is the main component.

This alloy in which aluminum is the main component could be any two-metal or three-metal alloy comprising at least one element selected from: copper, silicon, germanium, magnesium, cobalt, beryllium, etc.

A semiconductor device fabricated by the above fabrication method comprises:

a semiconductor substrate including an electronic element;

an interlayer dielectric formed on the semiconductor substrate;

a through-hole formed in the interlayer dielectric;

a barrier layer formed on surfaces of the through-hole and the interlayer dielectric; and a conductive layer formed on the barrier layer, and wherein the interlayer dielectric comprises:

a first silicon oxide layer formed by a polycondensation reaction between a silicon compound and hydrogen peroxide; and a second silicon oxide layer formed on the first silicon oxide layer and including an impurity.

PREFERRED EMBODIMENTS OF THE INVENTION

Figure 1A:
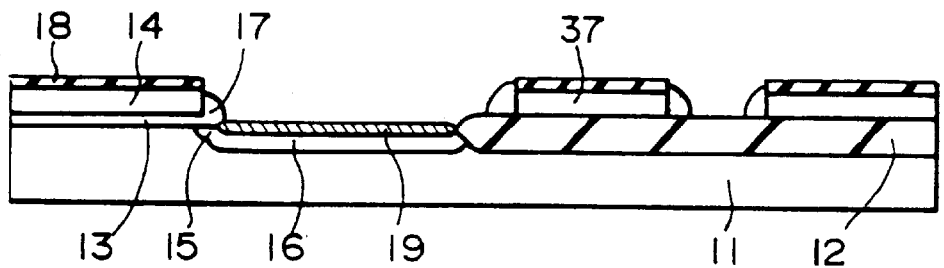
FIGS. 1A, 1B, and 1C are schematic cross-sectional views showing the processirrg sequence in an example of the method of fabricating a semiconductor device in accordance with the present invention.

Schematic cross-sectional views that illustrate an embodiment of the method of fabricating a semiconductor device in accordance with the present invention, together with the resultant semiconductor device, are shown in FIGS. 1A to 4B. The steps for fabricating a wiring region L1 for first layer are shown in FIGS. 1A to and 2B and the steps for fabricating a wiring region L2 for second layer are shown in FIGS. 3A to 4B.

An example of this method of fabricating a semiconductor device is described below.

A. The Description First Relates to the Processing Illustrated in FIG. 1A.

Fabrication of Electronic Element

A MOS electronic element is first formed on a silicon substrate 11 by a generally used method. More specifically, a field-insulation layer 12 is formed on the silicon substrate 11 by selective oxidation and a gate oxide layer 13 is formed in an active region thereof, by way of example. After the threshold voltage has been adjusted by channel implantation, $SiH_4$ is thermally decomposed to grow a polysilicon layer, then tungsten silicide is formed by sputtering on that polysilicon layer. A silicon oxide layer 18 is superimposed thereon, and this is etched to a predetermined pattern to form a gate electrode 14. At the same time, a wiring layer 37 is formed from the polysilicon layer and tungsten silicide layer on the field insulation layer 12, if necessary.

A low-density impurity layer 15 for the source or drain region is then formed by the implantation of phosphorus ions. After a side-wall spacer 17 has been formed from the silicon oxide layer on the sides of the gate electrode 14, arsenic ions are implanted, and these impurities are activated by annealing using a Halogen lamp to form a high-density impurity layer 16 for the source or drain region.

A silicon oxide layer of a thickness of not more than 100 nm is then formed by vapor deposition, and a predetermined silicon substrate region is exposed by selectively etching this layer in a mixed aqueous solution of hydrogen fluoride (HF) and $NH_4F$. Subsequently, for example, a titanium monosilicide layer is formed on the surface of the exposed silicon substrate and a titanium-rich titanium nitride (TiN) layer is formed on the silicon oxide layer 18 by sputtering titanium having a thickness of approximately 30 to 100 nm and by rapid annealing for approximately a few seconds to 60 seconds at a temperature of 650° C. to 750° C. in a nitrogen environment in which oxygen is controlled to be not more than 50 ppm. The wafer is then immersed in a mixed aqueous solution of ammonium hydroxide ($NH_4OH$) and hydrogen peroxide ($H_2O_2$) to etch away this titanium nitride layer, leaving the titanium monosilicide layer only on the surface of the silicon substrate. Lamp annealing at 750° C. to 850° C. is then performed to convert the monosilicide layer to a disilicide, so that the titanium silicide layer 19 is formed in a self-adjusting manner on the surface of the high-density impurity layer 16.

Note that if the gate electrode 14 is formed of polysilicon alone and it is exposed by selective etching, a titanium salicide structure is formed where the gate electrode is separated by side-wall spacers from both of the source and drain regions.

Note also that this salicide structure could be fabricated from tungsten silicide or molybdenum silicide, instead of titanium silicide.

B. The Description Now Concerns the Processing Illustrated in FIG. 1B.

Formation of First Interlayer Dielectric I1

A first interlayer dielectric I1 is configured of four silicon oxide layers: a fourth silicon oxide layer 20, a first silicon oxide layer 22, a second silicon oxide layer 24, and a third silicon oxide layer 26, in sequence from the bottom.

a. Formation of Fourth Silicon Oxide Layer 20

First of all, the fourth silicon oxide layer 20 is formed to a thickness of 100 to 200 nm by using a plasma chemical vapor deposition (CVD) method at 300° C. to 500° C. to cause tetraethoxysilane (TEOS) and oxygen to react. This silicon oxide layer 20 forms an extremely fine layer with better insulating properties and with a slower etching speed with respect to an aqueous hydrogen fluoride solution than a film grown from monosilane ($SiH_4$), without any oxidation or cusping of the titanium silicide layer 19.

In this case, the silicon oxide layer 20 is formed directly on the titanium silicide layer 19. If the film-formation temperature is high during this time, the oxidizing gases will react with the titanium silicide in the initial stages of the film formation, making cracking and peeling likely to occur, so the processing temperature is preferably 600° C. or less, or more preferably between 250° C. to 400° C. Once the silicon oxide layer has been formed to a thickness of approximately 100 nm on the titanium silicide layer 19 at this comparatively low temperature, raising the temperature to approximately 900° C. for annealing or vapor-phase oxidation performed in a non-steam oxidizing environment will not cause any problems.

b. Formation of First Silicon Oxide Layer 22

The first silicon oxide layer 22 is then formed by a reaction between $SiH_4$ and $H_2O_2$ by CVD, using nitrogen as a carrier gas, under a reduced pressure of preferably $2.5 \times 10^2$ Pa or less; more preferably between $0.3 \times 10^2$ and $2.0 \times 10^2$ Pa. The first silicon oxide layer 22 has a thickness that is larger than the gaps formed in the underlying fourth silicon oxide layer 20, in other words, the layer is formed to a thickness that sufficiently covers these gaps. The upper limit of the thickness of the first silicon oxide layer 22 is set to a level that does not result in cracks in that layer. More specifically, to ensure a desirable degree of flatness, the thickness of the first silicon oxide layer 22 is preferably thicker than the gaps in the lower layer, and more preferably between 300 and 1000 nm.

The temperature at which the first silicon oxide layer 22 is formed has an effect on the fluidity of the film during its formation. If the temperature is too high, the fluidity of the film deteriorates and the flatness thereof is lost, so it is preferable to set the temperature during the film-formation to between 0° C. and 20° C., or more preferably to between 0° C. and 10° C.

In addition, the flow rate of the $H_2O_2$ is not particularly limited, but it is preferable to have a density of 55 to 65 vol %, which is at least twice that of the $SiH_4$, for example. From the viewpoints of both the uniformity of the film and the throughput, it is preferable to set the flow rate of the gas to between 100 and 1000 SCCM.

The first silicon oxide layer 22 formed in this step is in a silanol polymer state, with a good fluidity and high self-flattening characteristics. In addition, this first silicon oxide layer 22 is in a state in which it comprises a large number of hydroxyl (—OH) groups and it has a high hygroscopicity.

c. Formation of Second Silicon Oxide Layer 24

After the wafer has been left alone in the interior of a chamber under a reduced pressure for 30 to 120 seconds to get rid a certain amount of the moisture in the first silicon oxide layer 22, a phospho-silicate glass (PSG) layer (second silicon oxide layer) 24 of a thickness of 100 nm to 600 nm is formed by inducing gaseous reactions by plasma CVD at a temperature of 300° C. to 450° C. and a high frequency of 200 kHz to 600 kHz in the presence of $SiH_4$, $PH_3$, and $N_2O$. It is preferable that this second silicon oxide layer 24 be formed soon after the first silicon oxide layer 22 is formed, or to be formed after the first silicon oxide layer 22 has been left in a moisture-free environment, from considerations of the high level of hygroscopicity of the first silicon oxide layer 22.

It is necessary to make the second silicon oxide layer 24 porous, from considerations of easily and sufficiently facilitating the desorption of gaseous components such as water or hydrogen from within the first silicon oxide layer 22 by the subsequent annealing process. It is therefore preferable to form the second silicon oxide layer 24 by plasma CVD at a temperature of not more than 450° C., more preferably 300° C. to 400° C.; with a high frequency at not more than 1 MHz, more preferably 200 kHz to 600 kHz; and with an impurity such as phosphorus. The inclusion of such an impurity in the second silicon oxide layer 24 not only ensures that the second silicon oxide layer 24 is in a porous state and can mitigate stresses applied thereto, but it also imparts a gettering effect thereto with respect to alkali ions or the like. The density of this impurity is set from consideration of factors such as the gettering effect and stress resistance. If the impurity is phosphorus, for example, it is preferable that it is included in the proportion of 2 to 6 wt %.

The desorption of hydrogen bonds from within the first silicon oxide layer 22 can be encouraged by using $N_2O$ as the compound comprising oxygen in the plasma CVD. As a result, gaseous components such as moisture and hydrogen comprised within the first silicon oxide layer 22 can be desorbed reliably.

The thickness of this second silicon oxide layer 24 is preferably at least 100 nm, and more preferably 100 nm to 600 nm, from consideration of its role in adjusting the thickness of the interlayer dielectric and the function of the $N_2O$ plasma to desorb the hydrogen bonds.

d. Annealing

The wafer is then annealed in a nitrogen environment at a temperature of 300° C. to 850° C., preferably at a temperature of 600° C. to 850° C. This annealing makes the first silicon oxide layer 22 and the second silicon oxide layer 24 more fine-grained, giving them good insulating properties and moisture resistance. In other words, setting the annealing temperature to at least 300° C. ensures that the condensation polymerization reaction of the silanol is substantially completed and the water and hydrogen within the layer are sufficiently removed, to form fine-grained layers. Setting the annealing temperature to not more than 850° C. makes it possible to achieve miniaturization of the electronic element, without any adverse effects such as punch-through or connection leakage in the diffusion layers of the source and drain regions configuring the MOS transistor.

To reduce the effects of thermal strain on the first silicon oxide layer 22 during the annealing, it is preferable to use ramping annealing in which the temperature of the wafer is increased either in steps or continuously. When, for example, the temperature of the wafer is held at approximately 400° C. then raised to the annealing temperature (600° C. 850° C.) it is possible to greatly reduce the density of the impurity in the second silicon oxide layer 24. It has been verified that if the impurity is phosphorus, for example, in addition to the gettering effect thereof with respect to mobile ions, cracking of the first silicon oxide layer 22 does not occur even when the density of phosphorus is not more than 2 wt %.

e. Formation of Third Silicon Oxide Layer 26

TEOS and oxygen are then used to form the third silicon oxide layer 26 to a thickness of 1000 nm to 1500 nm by plasma CVD at 350° C. to 400° C.

This use of plasma CVD to create a silicon oxide layer from TEOS and oxygen ensures that the first silicon oxide layer 22 and the second silicon oxide layer 24, which have been annealed at a high temperature, have a dry-etching speed which is substantially the same as that of the third silicon oxide layer 26, or which is slightly faster, even if no further annealing is performed. This is a factor in obtaining a contact hole of a good shape, without any constrictions or gaps in the side surfaces during the formation of the contact hole, which will be described below.

C. The Description Now Concerns the Processing Illustrated in FIG. 1C.

Flattening by CMP

The third silicon oxide layer 26, and also the second silicon oxide layer 24 and the first silicon oxide layer 22 if necessary, are then polished and flattened to a predetermined thickness by chemical/mechanical polishing (CMP). Since the polishing speeds for the first silicon oxide layer 22, the second silicon oxide layer 24, and the third silicon oxide layer 26 are substantially the same, a flat surface can be obtained by this polishing even if parts of the second silicon oxide layer 24 or even the first silicon oxide layer 22 are exposed on the surface, which facilitates control over the amount of polishing.

Research by the present inventors has determined that the polishing speeds for each of the silicon oxide layers are as follows:

First silicon oxide layer (annealing temperature 800° C.): 250 nm/minute

Second silicon oxide layer (annealing temperature 800° C.) 250 nm/minute

Third silicon oxide layer (no annealing): 250 nm/minute

BPSG film, for comparison (annealing temperature 900° C.): 350 nm/minute

D. The Description Now Concerns the Processing Illustrated in FIG. 2A.

Formation of Contact Hole

The silicon oxide layers 20, 22, 24, and 26 that form the first interlayer dielectric I1 are then selectively and anisotropically etched by a reactive ion etcher using $CHF_3$ and $CF_4$ as main gases, to form a contact hole 32 of a diameter of between 0.2 and 0.5 µm.

This contact hole 32 has a tapered form where the diameter thereof decreases linearly from an upper edge portion to a base portion thereof. The angle θ of this taper depends on the etching condition, thus cannot be specified unconditionally, but it could be between 5 and 15 degrees, for example. The reasons why a tapered through-hole is obtained in this manner are, firstly because the silicon oxide layers 20, 22, 24, and 26 have substantially the same etching speed basically, and also the etching speed of the first silicon oxide layer 22 is slightly slower than that of the second silicon oxide layer 24, and secondly because the boundary surfaces between these silicon oxide layers are extremely firm. It is also possible to deposit an aluminum layer firmly over the interior of the contact hole 32 of this tapered shape, as will be described below.

The present inventors have measured the dry-etching speeds of each of these silicon oxide layers. Note that the dry-etching was performed under conditions of: power: 800 W; pressure: 20 Pa; etching gas: $CF_4:CHF_3:He=1:2:9$.

First silicon oxide layer (annealing temperature: 800° C.): 525 nm/minute

Second silicon oxide layer (annealing temperature: 800° C.) 550 nm/minute

Third silicon oxide layer (no annealing): 565 nm/minute

BPSG film, for comparison (annealing temperature: 900° C.): 750 nm/minute

E. The Description Now Concerns the Processing Illustrated in FIG. 2B.

Degassing

The wafer is first subjected to thermal processing that includes a degassing step.

Lamp heating (thermal processing A) is performed in a lamp chamber for 30 to 60 seconds at a base pressure of $1.5 \times 10^{-4}$ Pa or less and a temperature of 150° C. to 350° C., preferably 150° C. to 250° C. Then a degassing is performed by thermal processing (degassing step: thermal processing B) for 30 to 300 seconds at a temperature of 150° C. to 550° C. in a separate chamber into which argon is introduced at a pressure of $1 \times 10^{-1}$ to $15 \times 10^{-1}$ Pa.

During this procedure, the first thermal processing A heats the entire wafer, including the rear and side surfaces thereof, to enable the removal of any moisture or the like adhering to the wafer.

The subsequent thermal processing B makes it possible to remove gaseous components (hydrogen and water), mainly from within the first silicon oxide layer 22 that forms part of the first interlayer dielectric I1. As a result, the generation of gaseous components from the first interlayer dielectric I1 during the subsequent step of forming the barrier and aluminum layers can be prevented.

In the present embodiment, a barrier layer 33 is formed of a multilayer which comprises a barrier film having a barrier function, and a conductive film. The conductive film is formed between the barrier film and the impurity diffusion layers formed on the silicon substrate, which are the source and drain regions, to increase the conductivity of the barrier film and the impurity diffusion layer. It is preferable that an ordinary substance is used as the barrier film, such as titanium nitride, titanium or tungsten. A refractory metal such as titanium, cobalt, or tungsten can be used as the conductive film. This titanium, cobalt, or tungsten reacts with the silicon of the substrate to form a silicide.

Since the barrier layer has gaseous components (oxygen, hydrogen, water, and nitrogen) in solid solution therein, which can be several tens of mol % in TiN and Ti films, removing the gaseous components from the first interlayer dielectric I1, before the films of the barrier layer are formed, is extremely effective for forming a good aluminum layer within the contact hole. If the gaseous components in the first interlayer dielectric I1 underlying the barrier layer are not removed sufficiently, the gaseous components within the first interlayer dielectric I1 will be released at the temperature achieved during the formation of the barrier layer (ordinarily: 300° C. or more), and these gases will be taken up into the barrier layer. In addition, these gases will be desorbed from the barrier layer and will exit from the boundary surface with the aluminum layer during the formation of the aluminum layer, which will have adverse effects on the adhesiveness and fluidity of the aluminum layer.

Formation of Barrier Layer

A titanium layer is formed by sputtering to a thickness of 20 to 70 nm, as the conductive film of the barrier layer 33, then a TiN film is formed in a separate chamber to a thickness of 30 to 150 nm, as the barrier film. The temperature for the barrier layer formation depends on the thickness thereof, but is selected to be within the range of 200° C. to 450° C. Note that this TiN film could be formed by sputtering TiN or by nitriding the surface of the titanium layer.

The wafer is then exposed to an oxygen plasma at a pressure of $0.1 \times 10^2$ Pa to $1.5 \times 10^2$ Pa for 10 to 100 seconds, then it is annealed in a nitrogen or hydrogen environment at 450° C. to 700° C. for 10 to 60 minutes so that titanium oxide is formed like islands in the barrier layer. This processing has been verified to improve the barrier capabilities of the barrier layer.

This annealing could be performed by thermal processing at 400° C. to 800° C. in a lamp annealing furnace comprising at least several hundred ppm and up to several percent of oxygen, to similarly improve the barrier capabilities of the barrier layer.

Note that a wetting layer (not shown in the figure) could be formed of a material such as titanium, cobalt, or silicon on the surface of the barrier layer 33, with the objective of improving the wettability with respect to the aluminum layer, which will be described later. The provision of such a wetting layer can increase the fluidity of the first aluminum layer. The thickness of this wetting layer could be at least a few tens of nm.

Degassing and Wafer Cooling before Formation of Aluminum Layers

Before the wafer is cooled, further thermal processing (thermal processing C) is performed in the lamp chamber at a base pressure of $1.5 \times 10^{-4}$ Pa or less and a temperature of 150° C. to 250° C. for 30 to 60 seconds, to remove substances such as water that may be adhering to the substrate. After that, but before the aluminum layers are formed, the temperature of the substrate is lowered to below 100° C., preferably to between room temperature and 50° C. This cooling step is important for lowering the substrate temperature that has been increased by the thermal processing C and could be performed by, for example, placing the wafer on a stage that has a water-cooling function and lowering the temperature of the wafer to a predetermined temperature thereby.

This cooling of the wafer ensures that only an extremely small amount of gas escapes from the first interlayer dielectric I1, the barrier layer 33, and all the surfaces of the wafer. As a result, it is adsorbed at the boundary surface between the barrier layer 33 and a first aluminum layer 34, making it possible to prevent the effects of harmful gases on the coverability and adhesiveness thereof.

Formation of Aluminum Layers

A film of aluminum comprising 0.2 to 1.0 wt % of copper is first formed at high speed by sputtering to a thickness of 150 to 300 nm at not more than 200° C., more preferably 30° C. to 100° C., to form the first aluminum layer 34. The wafer is then heated within the same chamber to raise the temperature thereof to between 420° C. and 460° C., and a film of aluminum containing copper is similarly formed at low speed by sputtering to a thickness of between 300 and 600 nm, to form a second aluminum layer 35. In this case, the "high speed" used during the formation of the aluminum layers depends on the film-formation conditions or design details of the device being fabricated and thus cannot be specified unconditionally, but as a rule it means a sputtering speed of at least 10 nm/s and "low speed" means a sputtering speed of 3 nm/s or less.

Figure 5:
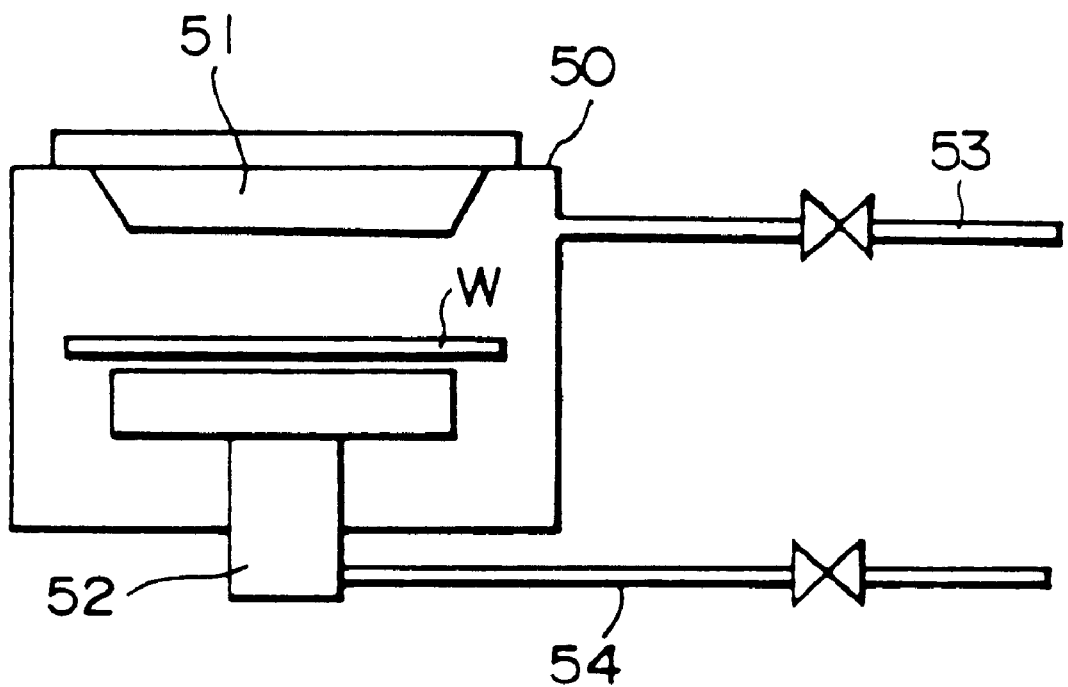
FIG. 5 is a schematic view of an example of the sputtering apparatus used in the present embodiment of the invention.

An example of the sputtering apparatus used for forming the first and second aluminum layers 34 and 35 is shown in FIG. 5. The structure of this sputtering apparatus is such that a target 51 that also acts as an electrode and an electrode 52 that also acts as a stage are provided within a chamber 50, and the substrate (wafer) w that is to be processed is placed on the electrode 52. A first gas supply path 53 is connected to the chamber 50 and a second gas supply path 54 is connected to the electrode 52. Argon is supplied from both of the gas supply paths 53 and 54. The temperature of the wafer W is controlled by the gas supplied from the second gas supply path 54. Note that means (not shown in the figure) is also provided for exhausting the gases from the interior of the chamber 50.

Figure 6:
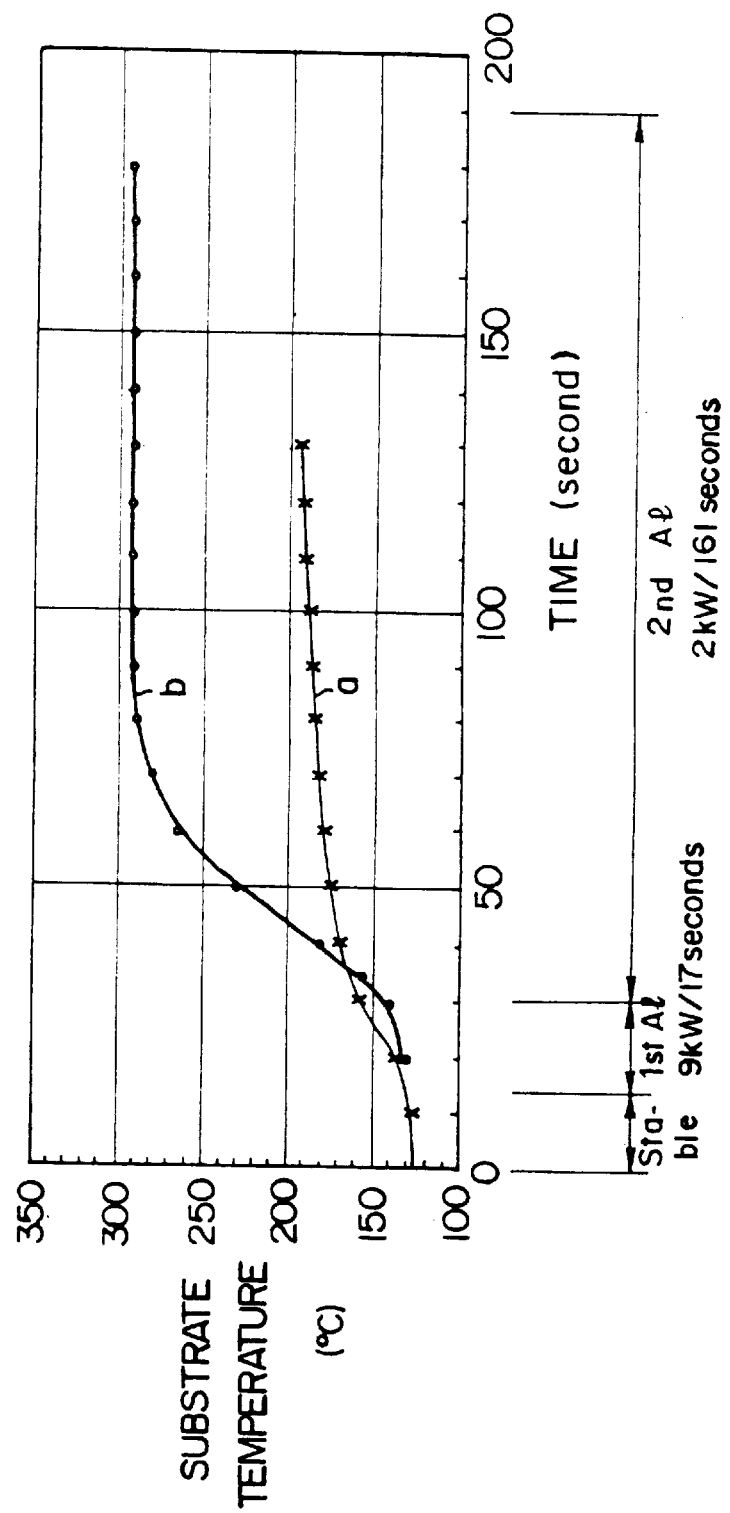
FIG. 6 is a graph of the relationship between time and substrate temperature, when the substrate temperature is controlled by the sputtering apparatus shown in FIG. 5.

An example of the substrate temperature control achieved by using this sputtering apparatus is shown in FIG. 6. In this graph, elapsed time is plotted along the horizontal axis and substrate (wafer) temperature along the vertical axis. Reference number a in FIG. 6 denotes the changes in substrate temperature when the temperature of the stage 52 of the sputtering apparatus is set to be 350° C., and reference number b denotes the changes in substrate temperature when temperature of the stage 52 is increased by supplying high-temperature argon through the second gas supply path 54 into the chamber.

The temperature could be controlled as described below, by way of example. First of all, the temperature of the stage 52 is previously set to the temperature for forming the second aluminum layer (350° C. to 500° C.). During the formation of the first aluminum layer, there is no supply of gas from the second gas supply path 54, so the substrate is heated by the stage 52 and thus the temperature rises gradually as shown by reference number a in FIG. 6. During the formation of the second aluminum layer, the temperature of the substrate is controlled by the supply of heated-gas through the second gas supply path 54 so that it rises rapidly and is held constant at a predetermined value, as shown by reference number b in FIG. 6.

In the example shown in FIG. 6, the first aluminum layer 34 is formed while the stage temperature is set to 350° C. and the substrate temperature is set to between 125° C. and 150° C., and the second aluminum layer 35 is formed immediately afterwards. Controlling over both the film-formation speed and substrate temperature during the formation of the aluminum layers is important as well as controlling over the power applied to the sputtering apparatus. In other words, relating to the film-formation speed, it is important that the power does not fall to zero during the switching between high and low power while the first aluminum layer 34 is being formed at high power and the second aluminum layer 35 is formed at low power. If the power falls to zero, an oxide layer will form on the surface of the first aluminum layer under the reduced pressure, deteriorating the wettability of the second aluminum layer with respect to the first aluminum layer and worsening the adhesiveness therebetween. In other words, applying the power constantly ensures that active aluminum is supplied continuously to the surfaces of the aluminum layers during the film formation, making it possible to suppress the formation of oxide layers. Note that the magnitude of the power depends on factors such as the sputtering apparatus and film-formation conditions, and thus cannot be specified unconditionally, but it is preferable to have a high power level of 5 kW to 10 kW and a low power level of 300 W to 1 kW under the temperature conditions shown in FIG. 6, by way of example.

The temperature and power can be controlled strictly by forming the first aluminum layer 34 and the second aluminum layer 35 consecutively within the same chamber in this manner, making it possible to form the aluminum layers efficiently at a lower temperature and more stably than in the conventional art.

Since the first aluminum layer 34 can be fabricated from successive layers with good step coverage, and also since the escape of gaseous components from the barrier layer 33 and the first interlayer dielectric I1 underneath this aluminum layer 34 can be suppressed, it is preferable to select an optimal range for the thickness of the first aluminum layer 34 to be 200 to 400 nm, for example. For the second aluminum layer 35, the thickness is determined by factors such as the size and aspect ratio of the contact hole, so a thickness of 300 to 1000 nm is necessary for filling a hole of 0.5 μm or less with an aspect ratio of 3.

Formation of Reflection Prevention Layer

A reflection prevention layer 36 of a thickness of 30 to 80 nm is then formed by the deposition of TiN by sputtering in a separate sputtering chamber. The stack consisting of the barrier layer 33, the first aluminum layer 34, the second aluminum layer 35, and the reflection prevention layer 36 is selectively etched by an anisotropic dry etcher using mainly $Cl_2$ and $BCl_3$ as gases, to pattern a first metal wiring layer 30 therefrom.

It has been confirmed that aluminum can be embedded within a contact hole of a diameter of 0.2 to 0.8 μm and with an aspect ratio of 0.5 to 3 by the thus-formed metal wiring layer 30, without creating any voids.

F. The Description Now Concerns the Processing Illustrated in FIG. 3A.

Formation of Second Interlayer Dielectric I2

A second interlayer dielectric I2 has basically the same structure as the first interlayer dielectric I1. In other words, the second interlayer dielectric I2 is formed of four silicon oxide layers: an eighth silicon oxide layer 70, a fifth silicon oxide layer 72, a sixth silicon oxide layer 74, and a seventh silicon oxide layer 76, in sequence from the bottom. Apart from the annealing, these silicon oxide layers 70, 72, 74, and 76 are fabricated by methods similar to those of the silicon oxide layers 20, 22, 24, and 26. The main components thereof are described below, but all other parts are common to previous sections so further description thereof is omitted.

a. Formation of Eighth Silicon Oxide Layer 70

First of all, the eighth silicon oxide layer 70 is formed to a thickness of 50 to 200 nm by using a plasma chemical vapor deposition (CVD) method at 300° C. to 500° C. to cause tetraethoxysilane (TEOS) and oxygen to react.

b. Formation of Fifth Silicon Oxide Layer 72

The fifth silicon oxide layer 72 is then formed by a reaction between $SiH_4$ and $H_2O_2$ caused by CVD at a temperature of 0° C. to 10° C., using nitrogen as a carrier gas, under a reduced pressure of preferably $2.5 \times 10^2$ Pa or less; more preferably between $0.3 \times 10^2$ Pa and $2.0 \times 10^2$ Pa. The fifth silicon oxide layer 72 has a thickness that is at least as large as the gaps formed in the underlying eighth silicon oxide layer 70, in other words, the layer is formed to a thickness that sufficiently covers these gaps, in a similar manner to the first silicon oxide layer 22. The upper limit of the thickness of the fifth silicon oxide layer 72 is set to a level that does not result in cracks in that layer. More specifically, to ensure a desirable degree of flatness, the thickness of the fifth silicon oxide layer 72 is preferably thicker than the gaps in the lower layer, and more preferably between 500 and 1000 nm.

The temperature at which the fifth silicon oxide layer 72 is formed is preferably 0° C. to 20° C.; more preferably 0° C. to 10° C.

The fifth silicon oxide layer 72 formed by this step has a high level of fluidity and superior flatness.

c. Formation of Sixth Silicon Oxide Layer 74

A PSG film (sixth silicon oxide layer) 74 is then formed to a thickness of 100 nm to 600 nm under condition by plasma CVD method at a temperature of 300° C. to 450° C. and a high frequency of 200 kHz to 600 kHz in the presence of $SiH_4$, $PH_3$, and $N_2O$.

It is necessary to make the sixth silicon oxide layer 74 porous, from considerations of facilitating the desorption of gaseous components such as water from within the fifth silicon oxide layer 72 by the subsequent annealing process, in a similar manner to the second silicon oxide layer 24. It is therefore preferable to form the sixth silicon oxide layer 74 by high-temperature plasma CVD at a temperature of not more than 450° C., more preferably 300° C. to 400° C.; with a high frequency of not more than 1 MHz, more preferably 200 kHz to 600 kHz; and with an impurity such as phosphorus. The inclusion of such an impurity in the sixth silicon oxide layer 74 ensures that the sixth silicon oxide layer 74 is in a more porous state and can mitigate stresses applied thereto. The density of this impurity is set from consideration of factors such as the gettering effect and stress resistance. If the impurity is phosphorus, for example, it is preferable that it is included in the proportion of 1 to 6 wt %.

The desorption of hydrogen bonds from within the fifth silicon oxide layer 72 can be encouraged by using $N_2O$ as the compound comprising oxygen in the plasma CVD. As a result, gaseous components such as moisture and hydrogen comprised within the fifth silicon oxide layer 72 can be desorbed reliably.

The thickness of the sixth silicon oxide layer 74 is preferably at least 100 nm; more preferably between 200 and 600 nm.

d. Annealing

The wafer is then annealed at a temperature of 350° C. to 450° C. This annealing makes the fifth silicon oxide layer 72 and the sixth silicon oxide layer 74 more fine-grained and gives them good insulating properties and moisture resistance. In other words, setting the annealing temperature to at least 350° C. ensures that the condensation polymerization reaction of the silanol is substantially completed and the moisture within the layers are sufficiently removed, to form fine-grained layers. Setting the annealing temperature to not more than 450° C. ensures there are no adverse effects on the aluminum layers of the first wiring layer 30.

e. Formation of Seventh Silicon Oxide Layer 76

TEOS and oxygen are then used to form the seventh silicon oxide layer 76 to a thickness of 1000 nm to 1500 nm by plasma CVD at 350° C. to 400° C.

G. The Description Now Concerns the Processing Illustrated in FIG. 3B.

Flattening by CMP

The seventh silicon oxide layer 76, and also the sixth silicon oxide layer 74 and the fifth silicon oxide layer 72 if necessary, are then polished and flattened to a predetermined thickness by CMP. A flat surface can be obtained by this polishing even if parts of the sixth silicon oxide layer 74 or the fifth silicon oxide layer 72 are exposed on the surface, which facilitates control over the amount of polishing.

H. The Description Now Concerns the Processing Illustrated in FIG. 4A.

Via Hole

The second interlayer dielectric I2 and the reflection prevention layer 36 are then selectively and anisotropically etched by a reactive ion etcher using $CHF_3$ and $CF_4$ as main gases, to form a via hole 62 of a diameter of 0.3 to 0.5 μm.

This via hole 62 has a tapered form where the diameter thereof decreases linearly from an upper edge portion to a base portion thereof, in a similar manner to that of the contact hole 32. The angle θ of this taper depends on an etching condition, thus cannot be specified unconditionally, but it could be between 5 and 15 degrees, for example.

I. The Description Now Concerns the Processing Illustrated in FIG. 4B.

Degassing

The wafer is first subjected to thermal processing that includes a degassing step.

Lamp heating (thermal processing D) is performed in a lamp chamber for 30 to 60 seconds at a base pressure of $1.5 \times 10^{-4}$ Pa or less and a temperature of 150° C. to 350° C., preferably 150° C. to 250° C. Then a degassing processing is performed by a thermal processing (degassing step: thermal processing E) for 30 to 300 seconds in a separate chamber into which argon is introduced at a pressure of $1\times10^{-1}$ Pa to $15\times10^{-1}$ Pa, at a temperature of 300° C. to 500° C.

During this procedure, the thermal processing D subjects the entire wafer, including the rear and side surfaces thereof, to heating to remove any moisture or the like adhering to the wafer.

The subsequent thermal processing E makes it possible to remove-gaseous components (hydrogen and water), mainly from within the second interlayer dielectric I2. As a result, the generation of gaseous components from the second interlayer dielectric I2 during the subsequent step of forming the wetting and aluminum layers can be prevented.

Since the wetting layer in the present embodiment has gaseous components (oxygen, hydrogen, water, and nitrogen) in solid solution therein, which can be several tens of mol % in TiN and Ti films, gaseous components are removed from the second interlayer dielectric I2 before this film is formed, which is also extremely effective for forming a good aluminum layer within the via hole. If the gaseous components in the second interlayer dielectric I2 underlying the wetting layer are not removed sufficiently, the gaseous components within the second interlayer dielectric I2 will be released at the temperature achieved during the formation of the wetting layer (ordinarily: 300° C. or more), and these gases will be taken up into the wetting layer. In addition, these gases will be desorbed from the wetting layer and will exit from the boundary surface between the wetting layer and the aluminum layer during the formation of the aluminum layer, which will have adverse effects on the adhesiveness and fluidity of the aluminum layer.

Formation of Wetting Layer

A titanium layer is formed by sputtering to a thickness of 20 to 70 nm, as a wetting layer 63. The sputtering temperature depends on the film thickness, but is selected to be within the range of 200° C. to 450° C.

Degassing and Wafer Cooling before Formation of Aluminum Layers

Before the wafer is cooled, further thermal processing (thermal processing F) is performed in the lamp chamber at a base pressure of $1.5\times10^{-4}$ Pa or less and a temperature of 150° C. to 250° C. for 30 to 60 seconds, to remove substances such as water that may be adhering to the substrate. After that, but before the aluminum layer is formed, the temperature of the substrate is lowered to below 100° C., preferably to between room temperature and 50° C. This cooling step is important for lowering the substrate temperature that has been increased by the thermal processing F and could be performed by, for example, placing the wafer on a stage that has a water-cooling function and lowering the temperature of the wafer to a predetermined temperature thereby.

This cooling of the wafer ensures that only an extremely small amount of gas escapes from the second interlayer dielectric I2, the wetting layer 63, and all the surfaces of the wafer when a first aluminum layer is formed. As a result, the effects of harmful gases on the coverability and adhesiveness that adsorbed at the boundary surface between the wetting layer 63 and a first aluminum layer 64 can be prevented.

Formation of Aluminum Layers

A film of aluminum comprising 0.2 to 1.0 wt % of copper is first formed at high speed by sputtering to a thickness of 150 to 300 nm at not more than 200° C., more preferably 30° C. to 100° C., to form the first aluminum layer 64. The substrate is then heated within the same chamber to raise the temperature thereof to between 420° C. and 460° C., and a film of aluminum comprising copper is similarly formed at low speed by sputtering to a thickness of between 300 and 600 nm, to form a second aluminum layer 65.

The same sputtering apparatus as that shown in FIG. 5 can be used therefor. Details of the structure of this sputtering apparatus relating to the temperature control of the wafer and the power used during the sputtering are the same as those described above with reference to the first metal wiring layer 30, so further description thereof is omitted.

The temperature and power can be controlled strictly by forming the first aluminum layer 64 and the second aluminum layer 65 consecutively within the same chamber, making it possible to form the aluminum layers efficiently at a lower temperature and more stably than in the conventional art.

With the consideration of fabricating successive layers with good step coverage, and also suppressing the escape of gaseous components from the wetting layer 63 and the second interlayer dielectric I2 underneath this aluminum layer 64, it is preferable to select an optimal range for the thickness of the first aluminum layer 34 to be 100 to 300 nm, for example. For the second aluminum layer 65, the thickness is determined by factors such as the size and aspect ratio of the via hole 62, so a thickness of 300 to 800 nm is necessary for filling a hole of 0.5 μm or less with an aspect ratio of 3.

Formation of Reflection Prevention Layer

A reflection prevention layer 66 of a thickness of 30 to 80 nm is then formed by the deposition of TiN by sputtering in a separate sputtering chamber. The stack consisting of the wetting layer 63, the first aluminum layer 64, the second aluminum layer 65, and the reflection prevention layer 66 is selectively etched by an anisotropic dry etcher using mainly $Cl_2$ and $BCl_3$ as gases, to pattern a second metal wiring layer 60 therefrom.

It has been confirmed that aluminum can be embedded within a via hole of a diameter of 0.2 to 0.8 μm and with an aspect ratio of 0.5 to 3 without creating any voids.

If necessary, third, fourth, and even further multi-layer wiring regions can be formed subsequently, in a similar manner to the second wiring region L2.

Figure 1B:
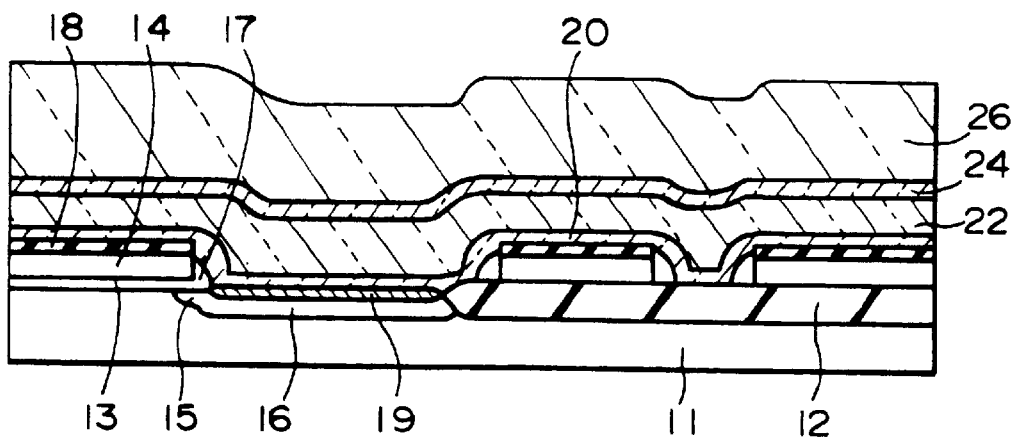
Figure 1C:
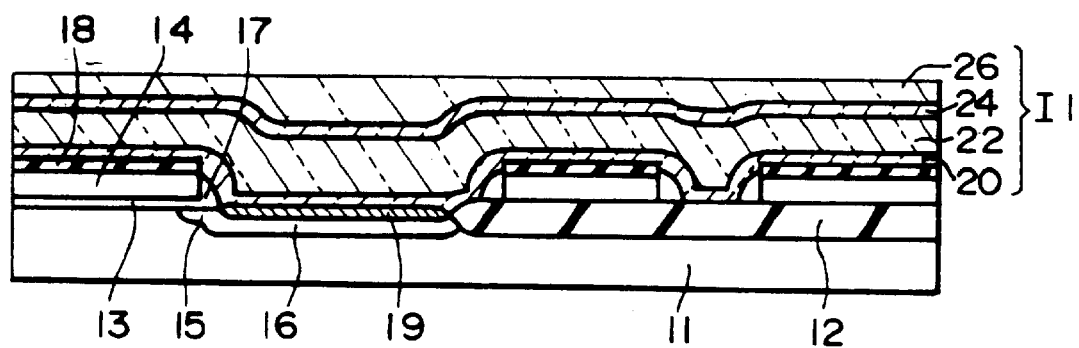
Figure 2A:
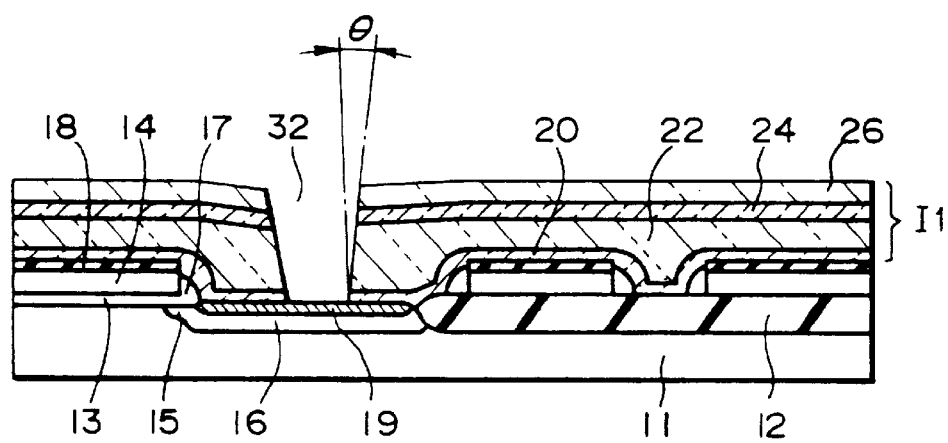
FIGS. 2A and 2B are schematic cross-sectional views showing the processing sequence in this example of the method of fabricating a semiconductor device, following on from the steps shown in FIGS. 1A to 1C.
Figure 2B:
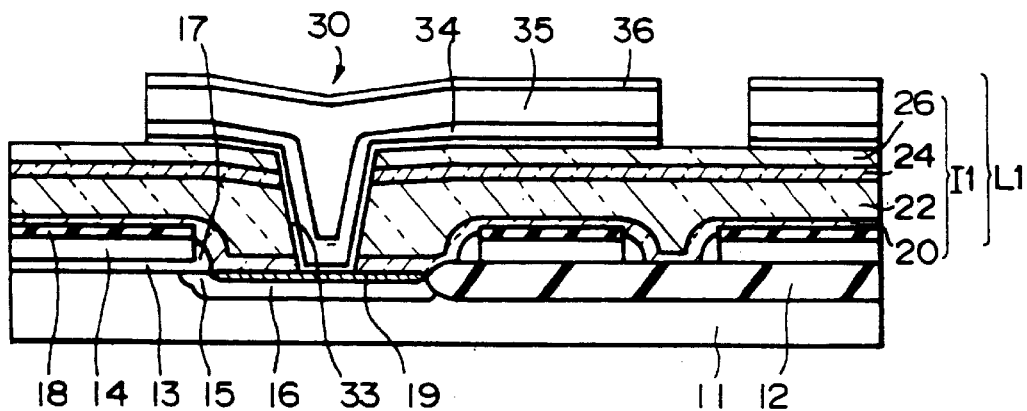
Figure 3A:
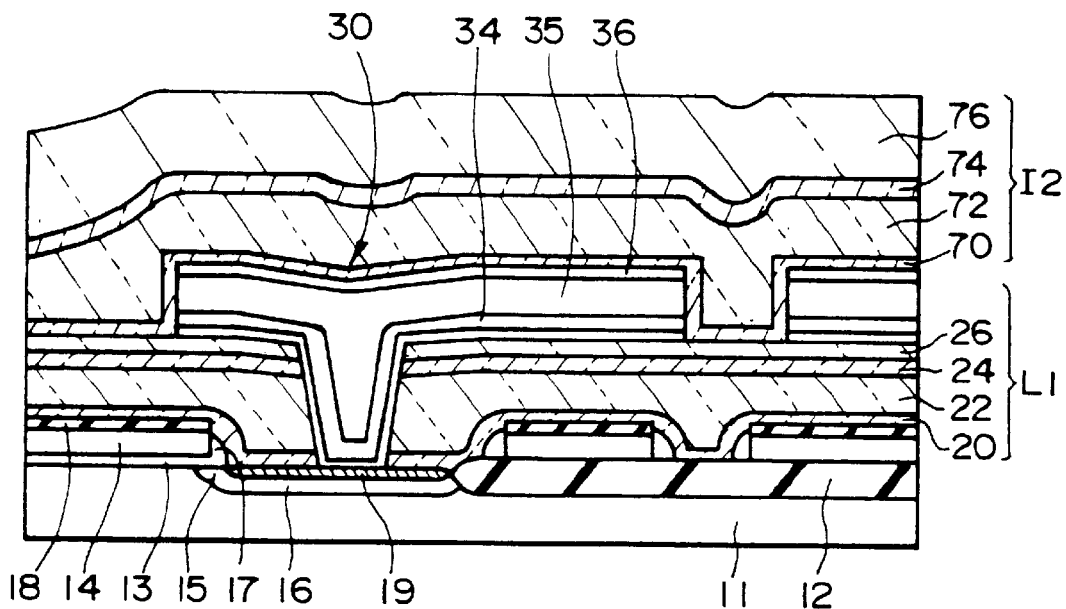
FIGS. 3A and 3B are schematic cross-sectional views showing the processing sequence in this example of the method of fabricating a semiconductor device, following on from the steps shown in FIGS. 2A and 2B.
Figure 3B:
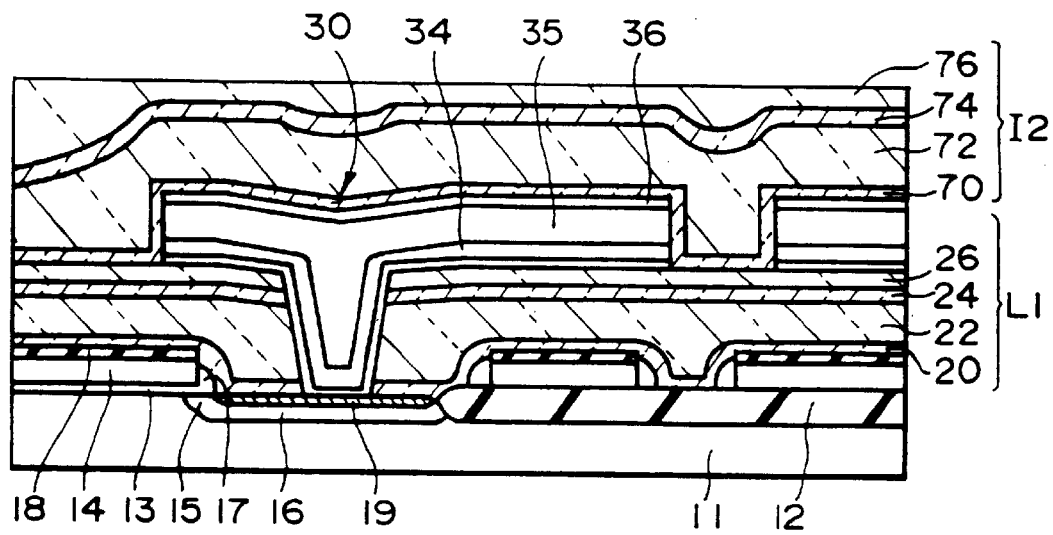

The reasons why the first and second interlayer dielectrics I1 and I2 have such a superior flatness are considered to be as follows:

(a) Since the reaction products, comprising silanol, formed by reactions between a silicon compound and hydrogen peroxide have a high degree of fluidity, any unevenness in the wafer surface of the first silicon oxide layer 22 and the fifth silicon oxide layer 72 fabricated by the processes shown in FIGS. 1B and 3A is flattened when these layers are formed.

(b) Since the silicon oxide layers configuring the first and second interlayer dielectrics I1 and I2 (particularly the first, second, and third silicon oxide layers 22, 24, and 26 as well as the fifth, sixth, and seventh silicon oxide layers 72, 74, and 76) have the same polishing speed when subjected to CMP, a good flatness can be achieved by CMP even if different silicon oxide layers are partially exposed on the surface.

The reasons why the first and second aluminum layers 34 and 35 and the first and second aluminum layers 64 and 65 can be embedded so well into the contact hole 32 and the via hole 62 are considered to be as follows:

(a) The generation of gas from the interlayer dielectrics I1 and I2 and the corresponding barrier layer 33 and wetting layer 63 can be prevented by performing the degassing steps to sufficiently release any water, hydrogen, and nitrogen comprised within each of the interlayer dielectrics I1 and I2 then forming the corresponding first aluminum layers 34 and 64 and the second aluminum layers 35 and 65. This makes it possible to form the layers with good adhesion between the barrier layer 33 and the first aluminum layer 34 and between the wetting layer 63 and the first aluminum layer 64, with good step coverage.

(b) In addition to the effects of these degassing steps, the adhesiveness of the first aluminum layers 34 and 64 is further increased by setting the temperature of the substrate to a comparatively low level of not more than 200° C. during the formation of the first aluminum layers 34 and 64, so that any moisture comprised within the interlayer dielectrics I1 and I2 and the corresponding barrier layer 33 and wetting layer 63 cannot escape therefrom.

(c) Furthermore, the first aluminum layers 34 and 64 themselves function to suppress gas to be generated from the underlying layers when the substrate temperature rises, making it possible to form the subsequent second aluminum layers 35 and 65 at a comparatively high temperature, which enables good fluid spreading of the second aluminum layers.

Figure 4A:
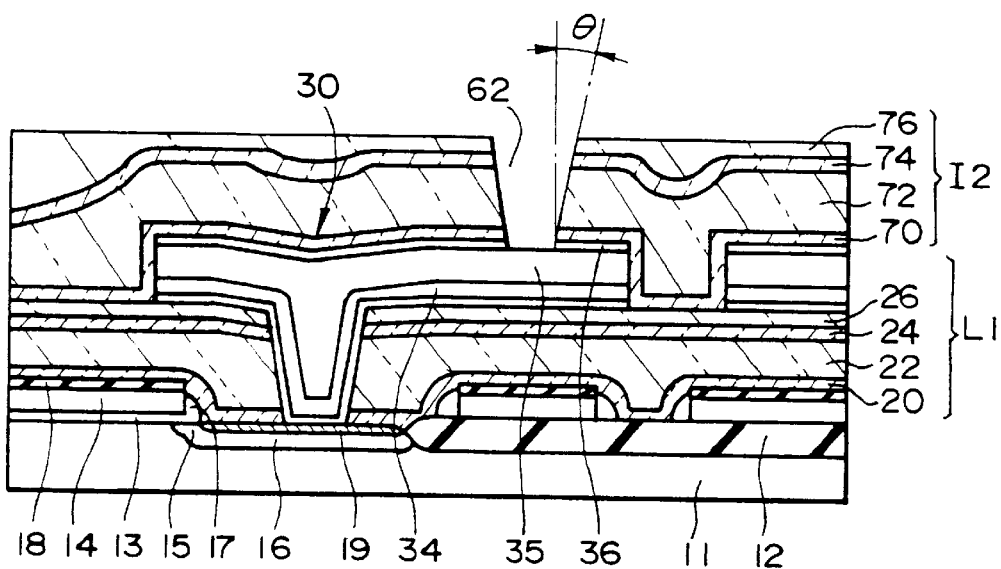
FIG. 4A and 4B are schematic cross-sectional views showing the processing sequence in this example of the method of fabricating a semiconductor device, following on from the steps shown in FIGS. 3A and 3B.
Figure 4B:
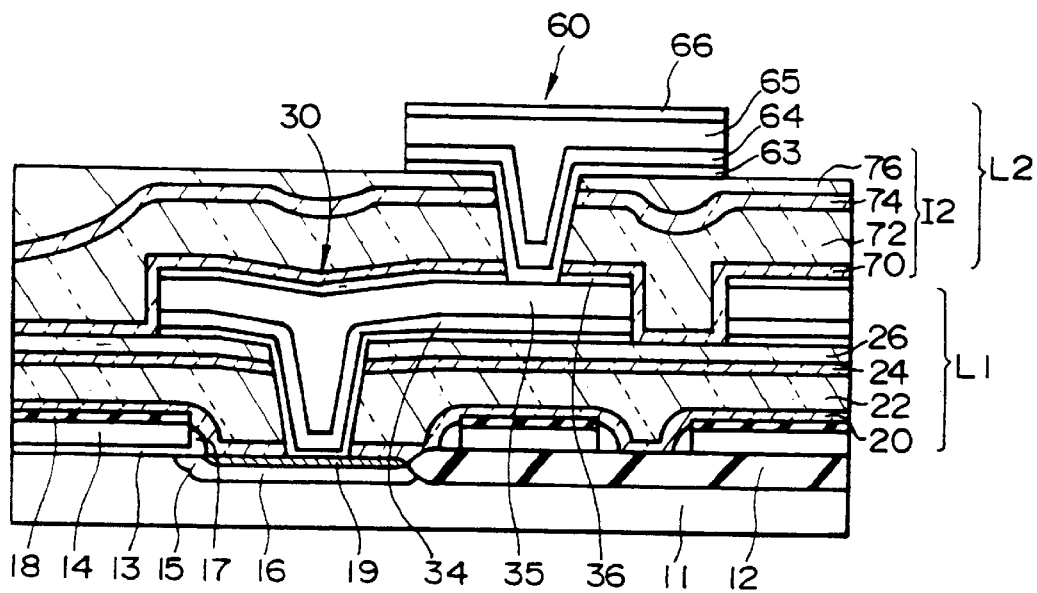

A semiconductor device in accordance with the present invention can be fabricated by the above method (see FIG. 4B). This semiconductor device has a silicon substrate 11 comprising at least a MOS element and a first wiring region L1 formed on the silicon substrate 11.

The first wiring region L1 comprises the first interlayer dielectric I1 (which consists of the fourth silicon oxide layer 20 forming a base layer, the first silicon oxide layer 22 formed by a polycondensation reaction between a silicon compound and hydrogen peroxide, the second silicon oxide layer 24 formed an the first silicon oxide layer 22 and comprising an impurity such as phosphorus, and the third silicon oxide layer 26 formed on the second silicon oxide layer 24 and flattened by CMP), the contact hole 32 formed in the first interlayer dielectric I1, the barrier layer 33 formed on the surfaces of the first interlayer dielectric I1 and the contact hole 32, and the aluminum layers 34 and 35 formed of aluminum or an alloy in which aluminum is the main component. This aluminum layer 34 is connected to the titanium silicide layer 19 by the barrier layer 33.

The second wiring region L2 formed on the first wiring region L1 comprises the second interlayer dielectric I2 (which consists of the eighth silicon oxide layer 70 that forms a base layer, the fifth silicon oxide layer 72 formed by polycondensation reactions between a silicon compound and hydrogen peroxide, the sixth silicon oxide layer 74 formed on the fifth silicon oxide layer 72 and comprising an impurity such as phosphorus, and the seventh silicon oxide layer 76 formed on the sixth silicon oxide layer 74 and flattened by CMP), the via hole 62 formed in the second interlayer dielectric I2, the wetting layer 63 formed on the surfaces of the second interlayer dielectric I2 and the via hole 62, and the aluminum layers 64 and 65 formed of aluminum or an alloy in which aluminum is the main component.

In this manner, the present invention makes it possible to fabricate interlayer dielectrics that have an extremely good degree of flatness, by forming several silicon oxide layer comprising silanol obtained by vapor-phase reactions between a silicon compound and hydrogen peroxide, then flattening the uppermost layer by CMP. Since the first interlayer dielectric in particular can be fabricated at a temperature that is much lower than that required for a conventional art BPSG film, it enables improvements in the characteristics relating to punch-through and connection leakage, which makes it possible to achieve miniaturization of the electronic elements and a highly reliable contact structure, and is thus advantageous from the fabrication point of view. The high degree of flatness of the interlayer dielectrics enables increases in the processing margins, including factors such as the machining of the wiring layers, and thus enables improvements in product quality and yield.

In addition, the inclusion of at least the degassing step and cooling step before the sputtering of the aluminum layers and preferably the consecutive formation of the aluminum layers within the same chamber, have made it possible to fill contact holes and via holes having a diameter of about 0.2 $\mu$m with aluminum or aluminum alloy alone, and improve reliability and yield. It has also been confirmed that there is no segregation or abnormal growth of crystal grains in the copper or the like within the aluminum layers that form the contact portions, which is also advantageous from the reliability viewpoint such as migration.

Other Embodiments

The present invention is not limited to the above described embodiment and various parts thereof can be replaced by other means, as described below.

(a) In the above embodiment, nitrous oxide was used as the compound comprising oxygen during the formation of the second silicon oxide layer 24 by plasma CVD, but ozone could be used instead. It is also preferable to expose the wafer to an ozone environment before the second silicon oxide layer 24 is formed.

Figure 7:
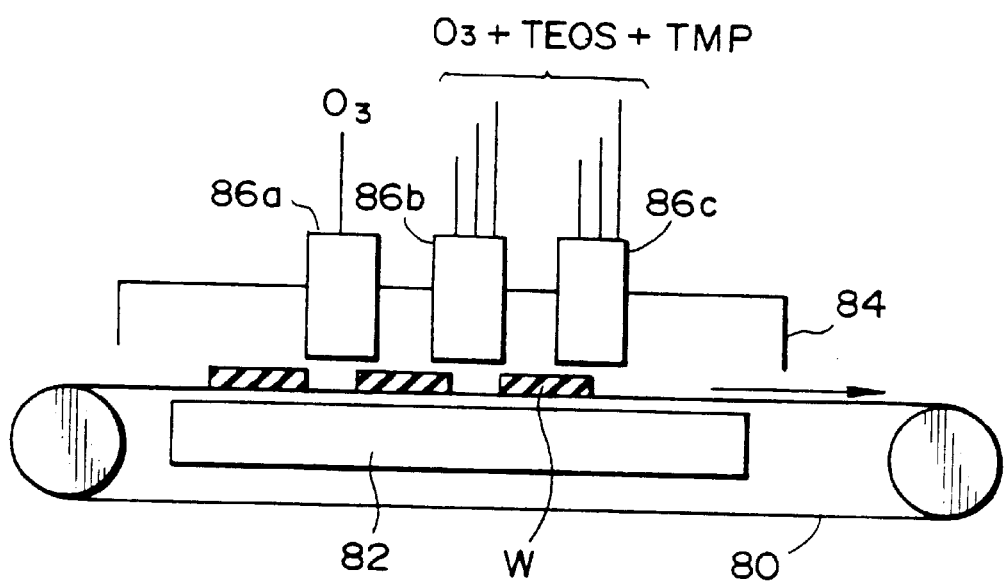
FIG. 7 is a schematic view of a belt furnace used in the fabrication of a semiconductor device.

Using the belt furnace shown in FIG. 7, for example, a wafer W is placed on a conveyer belt 80 that is heated to 400° C. to 500° C. by a heater 82, and is moved at a predetermined speed thereby. During this time, ozone is supplied from a first gas head 86a, so that the wafer W spends at least 5 minutes in a 2 to 8 wt % ozone environment. Ozone, TEOS, and TMP ($P(OCH_3)_3$) are then supplied from second and third gas heads 86b and 86c at substantially normal pressure, so that a PSG film (second silicon oxide layer) 24 of a thickness of 100 nm to 600 nm and comprising 3 to 6 wt % of phosphorus is formed. Note that reference number 84 in FIG. 7 denotes a cover.

This use of ozone instead of nitrous oxide makes it possible to form the silicon oxide layer from TEOS, using normal-pressure CVD. In addition, the use of a belt furnace makes it possible to perform the film-formation continuously and efficiently.

In addition, it has been confirmed by thermal desorption spectrum (TDS) and fourier transform infrared spectroscopy (FTIR) that this exposure of the wafer W to an ozone environment ensures that the hygroscopicity and moisture of the first silicon oxide layer 22 are sufficiently small, the flatness of the first interlayer dielectric II and the characteristics of the MOS transistor are as excellent as those of an electronic element formed by using nitrous oxide as the reaction gas, and no cracking occurs in the first silicon oxide layer 22.

(b) In the above embodiment, a silicon oxide layer formed by using TEOS in plasma CVD was used as the fourth silicon oxide layer 20, but another type of silicon oxide layer could be used instead. For example, a film formed by reduced-pressure thermal CVD using monosilane and nitrous oxide could be used as this fourth silicon oxide layer. This silicon oxide layer is formed to follow the surface shape of the underlying silicon substrate closely, so not only does it have good coverability, it is also fine-grained and thus it has a good passivation function. In addition, the rapid rise in temperature during the annealing unlikely makes cracking in the first silicon oxide layer 22. The use of thermal CVD has the advantage of avoiding plasma damage.

It should be noted, however, that since it is necessary to set the wafer temperature to between approximately 750° C. and 800° C. when forming a film by this method, it is not suitable for use with a film that oxidizes easily, as a salicide structure, such as titanium silicide. It is, thus, necessary to use tungsten silicide or molybdenum silicide instead.

(c) In the above embodiment, the first interlayer dielectric I1 has a configuration comprising four silicon oxide layers, but the present invention is not limited thereto and other silicon oxide layers can be added. For example, a PSG film (phosphorus density: 1 to 6 wt %) could be formed by plasma CVD between the fourth silicon oxide layer 20 and the first silicon oxide layer 22. It has been confirmed that the insertion of this PSG film further improves the gettering function of mobile ions, and reduces changes in the threshold characteristics and static current.

(d) Furthermore, in the above embodiment, the third silicon oxide layers 26 and 76 are formed as part of the interlayer dielectrics I1 and I2, and these are flattened by CMP. However, since the first silicon oxide layers 22 and 72 have an inherently good flatness in themselves, it is not absolutely necessary to provide the third silicon oxide layers 26 and 76.

Note that the above described embodiments related to semiconductor devices that comprise two-layer wiring regions, but the present invention can of course be applied to semiconductor devices having wiring regions of three or more layers. In addition, the present invention is not limited to semiconductor devices including the n-channel type of MOS electronic element; it can also be applied to semiconductor devices comprising various other types of electronic elements such as p-channel or CMOS electronic elements.

What is claimed is:

1. A method of fabricating a semiconductor device, comprising the steps of:
   forming an interlayer dielectric on a semiconductor substrate including an electronic element;
   forming a through-hole in said interlayer dielectric;
   forming a barrier layer on surfaces of said interlayer dielectric and said through-hole; and
   forming a conductive layer on a surface of said barrier layer, and
   wherein said step of forming an interlayer dielectric comprises at least the following steps (a) to (c):
   (a) forming a first silicon oxide layer by reacting a silicon compound with hydrogen peroxide using a chemical vapor deposition method;
   (b) forming a porous second silicon oxide layer by reacting a compound including an impurity, a silicon compound, and at least one substance selected from oxygen and compounds including oxygen using a chemical vapor deposition method to permit gaseous by-products to escape therefrom; and
   (c) annealing at a temperature of 300° C. to 850° C.

2. The method of fabricating a semiconductor device as defined in claim 1, wherein:
   said silicon compound used in said step (a) is at least one substance selected from inorganic silane compounds such as monosilane, disilane, $SiH_2Cl_2$, and $SiF_4$; and organic silane compounds such as $CH_3SiH_3$, tripropylsilane, and tetraethoxysilane.

3. The method of fabricating a semiconductor device as defined in claim 1, wherein said silicon compound used in said step (a) is an inorganic silane compound and said step (a) is performed by a reduced-pressure chemical vapor deposition method under a temperature condition of 0° C. to 20° C.

4. The method of fabricating a semiconductor device as defined in claim 1, wherein said silicon compound used in said step (a) is an organic silane compound and said step (a) is performed by a reduced-pressure chemical vapor deposition method under a temperature condition of 100° C. to 150° C.

5. The method of fabricating a semiconductor device as defined in claim 1, wherein said step (b) is performed by a plasma chemical vapor deposition method under a temperature condition of 300° C. to 450° C.

6. The method of fabricating a semiconductor device as defined in claim 5, wherein said compound comprising oxygen used in said step (b) is nitrous oxide.

7. The method of fabricating a semiconductor device as defined in claim 1, wherein said step (b) is performed by a normal-pressure chemical vapor deposition method under a temperature condition of 300° C. to 550° C.

8. The method of fabricating a semiconductor device as defined in claim 7, wherein said compound comprising oxygen used in said step (b) is ozone.

9. The method of fabricating a semiconductor device as defined in claim 1, wherein said first silicon oxide layer is exposed to an ozone environment, before said second silicon oxide layer is formed in said step (b).

10. The method of fabricating a semiconductor device as defined in claim 1, wherein before said step (a), a silicon oxide layer that forms a base layer is formed by using a chemical vapor deposition method to react at least one substance selected from oxygen, and compounds comprising oxygen with silicon compounds.

11. The method of fabricating a semiconductor device as defined in claim 1, wherein said annealing in said step (c) is performed by raising the temperature either continuously or intermittently.

12. The method of fabricating a semiconductor device as defined in claim 1, wherein said through-hole has a tapered shape of a diameter that decreases gradually from an upper edge portion thereof towards a base portion thereof.

13. The method of fabricating a semiconductor device as defined in claim 1, wherein said conductive layer comprises a first aluminum layer formed at a temperature of not more than 200° C. from at least one of aluminum and an alloy in which aluminum is the main component, then a second aluminum layer is formed thereon at a temperature of not less than 300° C. from at least one of aluminum and an alloy in which aluminum is the main component.

14. The method of fabricating a semiconductor device as defined in claim 1, wherein the impurity used in said step (b) is phosphorus.

15. A method of fabricating a semiconductor device, comprising the steps of:
   forming an interlayer dielectric on a semiconductor substrate including an electronic element;
   forming a through-hole in said interlayer dielectric;
   forming a barrier layer on surfaces of said interlayer dielectric and said through-hole; and
   forming a conductive layer on a surface of said barrier layer, and
   wherein said step of forming an interlayer dielectric comprises at least the following steps (a) to (c):
   (a) forming a first silicon oxide layer by reacting a silicon compound with hydrogen peroxide using a chemical vapor deposition method;

(b) forming a porous second silicon oxide layer by reacting a compound including an impurity, a silicon compound, and at least one substance selected from oxygen and compounds including oxygen using a chemical vapor deposition method to prevent an increase in the tension stresses that occur in the first silicon oxide layer; and (c) annealing at a temperature of 300° C. to 850° C.

* * * * *